(12) United States Patent
Naot et al.

(10) Patent No.: US 7,397,088 B2
(45) Date of Patent: Jul. 8, 2008

(54) ELECTROSTATIC DISCHARGE PROTECTION DEVICE FOR RADIO FREQUENCY APPLICATIONS BASED ON AN ISOLATED L-NPN DEVICE

(75) Inventors: Ira Naot, Migdal Haemek (IL); Yaron Blecher, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 182 days.

(21) Appl. No.: 11/277,607

(22) Filed: Mar. 27, 2006

(65) Prior Publication Data
US 2007/0223162 A1 Sep. 27, 2007

(51) Int. Cl.
*H01L 23/62* (2006.01)
(52) U.S. Cl. .................. 257/355; 257/362; 361/91.5
(58) Field of Classification Search .................. 257/355, 257/362, 565, 577; 361/91.5
See application file for complete search history.

(56) References Cited

U.S. PATENT DOCUMENTS 5,886,386 A * 3/1999 Tailliet ........................ 257/362

OTHER PUBLICATIONS

"Zener substrate triggering for CMOS ESD protection devices", by Y. Blecher & R. Fried, pp. 2102-2103, Electronics Letters, Oct. 24, 1996, vol. 32, No. 22.
Leenaerts et al. "Bond Pad and ESD Protection Structure for 0.25 μm/0.18 μm RF-CMOS", Proceedings of the 29th European Solid-State Circuits Conference, Sep. 16-18, 2003, pp. 569-572.

* cited by examiner

*Primary Examiner*—Mark Prenty
(74) *Attorney, Agent, or Firm*—Bever, Hoffman & Harms, LLP; E. Eric Hoffman

(57) ABSTRACT

A lateral bipolar transistor is used to protect a passive radio frequency (RF) microelectronic circuit during electrostatic discharge (ESD) events. The microelectronic circuit receives a high frequency differential input signal across first and second pads. The lateral bipolar transistor includes an n-type emitter coupled to the first pad and an n-type collector coupled to the second pad. The emitter and collector are located in a p-well, which forms the base of the transistor. The p-well is located in an isolating n-well, which in turn, is located in a p-type substrate. The n-well is coupled to receive the $V_{DD}$ supply voltage and the p-substrate is coupled to a $V_{SS}$ reference voltage. A dielectric region can be located between the emitter and collector (in the p-well).

32 Claims, 4 Drawing Sheets

ELECTROSTATIC DISCHARGE PROTECTION DEVICE FOR RADIO FREQUENCY APPLICATIONS BASED ON AN ISOLATED L-NPN DEVICE

FIELD OF THE INVENTION

The present invention relates to an electrostatic discharge (ESD) protection circuit for a device that receives high frequency differential signals.

RELATED ART

Electrostatic discharge (ESD) events occur when a large current pulse is discharged through a microelectronic circuit. The ESD event is typically created when a charged object (e.g., a human or a machinery part) comes in contact with one of the electrical connections of the microelectronic circuit. The electrostatic charge discharges through the microelectronic circuit, potentially destroying the circuit. In order to protect microelectronic circuits from ESD events, ESD protection circuits are added near the circuit electrical connections (e.g., pads).

ESD protection circuits should have low losses during normal operation of the microelectronic circuit, and be triggered by an ESD event to discharge the electrostatic charge pulse in a safe manner. During normal operation, the ESD protection circuit should conduct no current and have as little parasitic capacitance or inductance as possible. During an ESD event, the ESD protection circuit should open (be triggered) to pass the large current pulse safely, without damaging either the ESD protection circuit or the circuit intended to be protected.

Existing ESD protection circuits in CMOS VLSI circuits are either based on grounded-gate NMOS (ggNMOS) transistors or on a diode network.

ESD protection circuits that implement ggNMOS transistors suffer from the following drawbacks when used in high frequency applications, such as radio frequency (RF) applications. Note that the term high frequency, as used herein, includes frequencies greater than about 1 GHz. Radio frequencies are defined as frequencies in the range of about 300 MHz to about 10 GHz.

First, ggNMOS-based ESD protection circuits exhibit a high parasitic capacitance, which hinders high frequency operation. The high parasitic capacitance causes a significant portion of the power received (e.g., by an antenna) to be dissipated, thus creating a significant power loss. Passive RF devices receive all of their power from an RF signal, so minimizing power loss is critical.

Moreover, one of the triggering mechanisms in a ggNMOS-based ESD protection circuit during an ESD event is the signal rate of rise. In RF operation, the intended signal has a high frequency, so the rate of signal change is similar to the rate of rise in an ESD event. As a result, the ESD protection circuit is partially triggered (opened) during normal operation of the RF device, thereby causing high loss of current.

Finally, a ggNMOS-based ESD protection circuit requires each electrical connection to have a defined polarity (i.e., a positive or negative voltage), relative to the supply reference ($V_{SS}$) or the supply power ($V_{DD}$). In a passive RF device (e.g., RFID tag or contactless smart card), there is no external power supply. The only connections out of the passive RF device are connected to the two sides of an antenna. In such passive RF devices, the polarity of the external connections is not defined. Often, a pair of connections carries a differential RF signal and the polarity of the two connections changes at a high (RF) frequency.

Diode-based ESD protection circuits have a lower parasitic capacitance than ggNMOS-based ESD protection circuits, and are not triggered by the signal rate of rise. However, diode-based ESD protection circuits typically require the applied signal level to vary between the externally supplied ground supply voltage ($V_{SS}$) and the externally supplied power supply voltage ($V_{DD}$). Thus, neither ggNMOS-based nor diode-based ESD protection circuits are suitable for use in passive RF microelectronic circuits.

It would therefore be desirable to have an ESD protection circuit suitable for use in circuits that operate in response to high frequency differential signals. In particular, it would be desirable to have an ESD protection circuit suitable for use in passive RF microelectronic circuits.

SUMMARY

Accordingly, the present invention provides an ESD protection circuit that includes a lateral bipolar transistor. The lateral bipolar transistor can be used to protect a passive radio frequency (RF) microelectronic circuit during electrostatic discharge (ESD) events. First and second pads of the microelectronic circuit are configured to receive a high frequency differential input signal. The protected circuitry is coupled to the first and second pads, thereby allowing the protected circuitry to receive the high frequency differential input signal.

The lateral bipolar transistor includes an n-type emitter coupled to the first pad and an n-type collector coupled to the second pad. The emitter and collector are located in a p-well region, which forms the base of the lateral bipolar transistor. The p-well region is located in an isolating n-well region, which in turn, is located in a p-type substrate. The n-well is coupled to receive the $V_{DD}$ supply voltage and the p-type substrate is coupled to the $V_{SS}$ supply voltage. A dielectric region can be located between the emitter and collector (in the p-well).

During normal operation of the protected circuit, the lateral bipolar transistor does not introduce significant leakage currents or parasitic capacitance. When an ESD event occurs, diode elements inherent within the lateral bipolar transistor will conduct avalanche (breakdown) current in response to excessively high voltages applied to either the first or second pad. The avalanche current serves as base current that opens the L–NPN transistor. The open L–NPN transistor discharges the ESD current pulse, thereby protecting the associated protected circuitry.

Advantageously, the lateral bipolar transistor can be fabricated in accordance with conventional CMOS processing techniques.

The present invention will be more fully understood in view of the following description and drawings.

DETAILED DESCRIPTION

Figure 1:
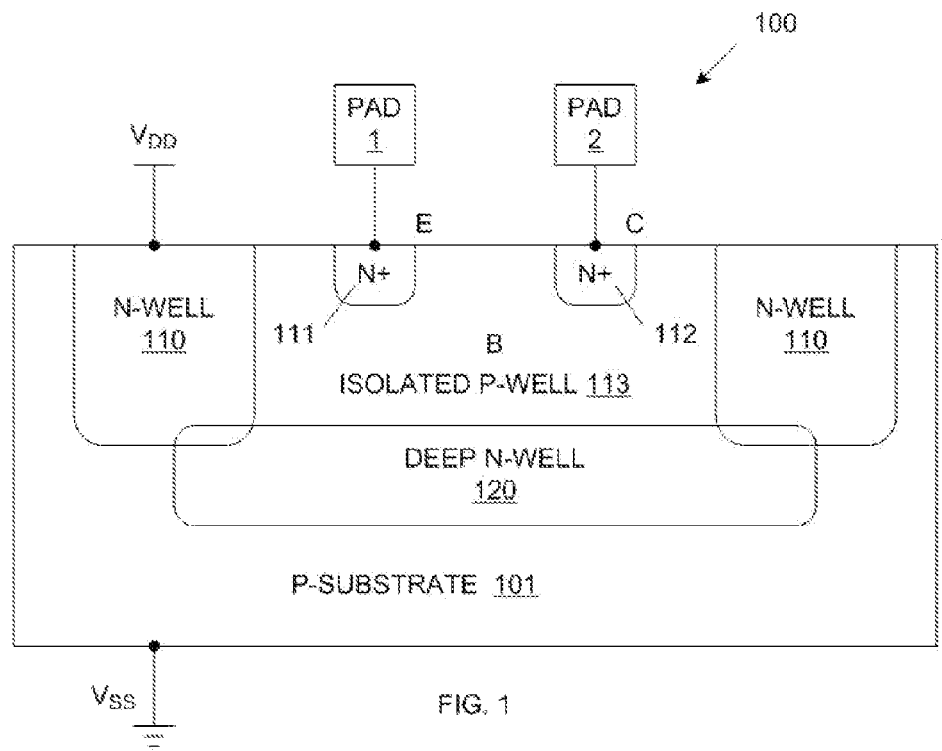
FIG. 1 is a cross-sectional view of an ESD protection circuit in accordance with one embodiment of the present invention.

FIG. 1 is a cross-sectional view of an ESD protection circuit 100 in accordance with one embodiment of the present invention. ESD protection circuit 100 includes p-type semiconductor substrate 101, n-well region 110, N+ emitter/collector regions 111 and 112, isolated p-well/base region 113 and deep n-well region 120. In the described embodiment, p-type substrate 101 is monocrystalline silicon. P-type substrate 101 is coupled to receive a reference voltage ($V_{SS}$), which may be provided from various sources. For example, reference voltage $V_{SS}$ may be provided on one of the two pads 1 or 2, or from the protected circuitry 222. Deep n-well 120 is formed below the upper surface of substrate 101, and defines the lower boundary of isolated p-well/base region 113. N-well 110 extends downward from the upper surface of substrate 101 and contacts deep n-well 120. N-well region 110 defines the sidewall boundary of isolated p-well/base region 113 by laterally surrounding this region 113. N-well region 110 (and therefore deep n-well region 120) is coupled to receive a positive supply voltage ($V_{DD}$), which may be provided from various sources. For example, the $V_{DD}$ voltage may be provided from the protected circuitry 222.

Other semiconductor devices of a microelectronic circuit (not shown in FIG. 1) are also fabricated on substrate 101. Selected portions of the microelectronic circuit may be connected to electrically conductive pads 1 and 2. Pads 1 and 2 are fabricated using methods well known in the semiconductor processing art, and are used to couple the microelectronic circuitry fabricated on substrate 101 to external circuitry. N+ emitter/collector region 111 is coupled to pad 1, and N+ emitter/collector region 112 is coupled to pad 2. In one embodiment, an antenna, configured to receive RF signals, may be coupled across pads 1 and 2, although this is not necessary.

ESD protection circuit 100 may be viewed as a lateral NPN bipolar transistor located in an isolated p-well region 113, wherein N+ emitter/collector regions 111 and 112 form an emitter and a collector of the transistor, and isolated p-well region forms a base of the transistor.

Figure 2:
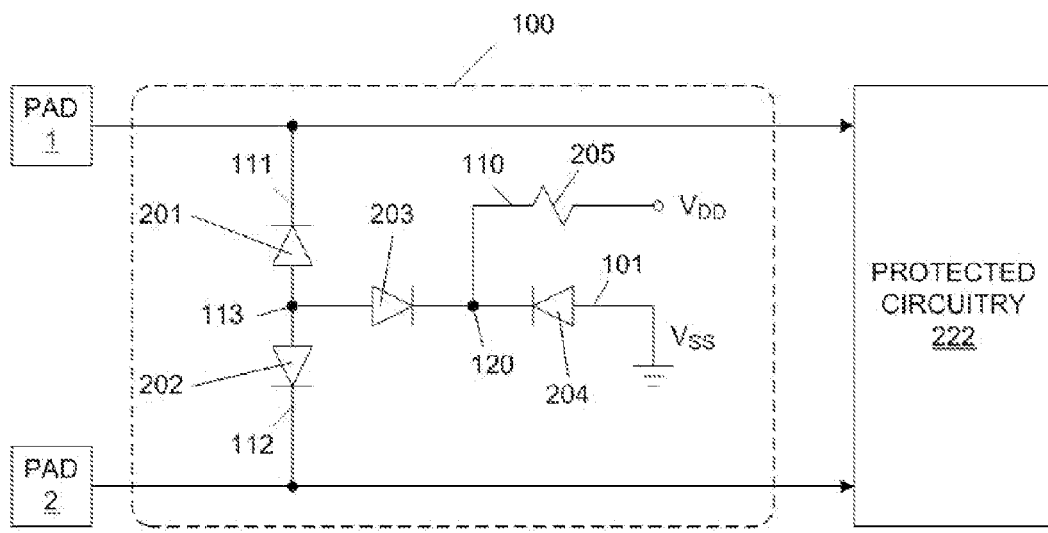
FIG. 2 is a circuit diagram of the ESD protection circuit of FIG. 1 in accordance with one embodiment of the present invention.

FIG. 2 is a circuit diagram of ESD protection circuit 100 in accordance with one embodiment of the present invention. As illustrated in FIG. 2, the various p-type and n-type regions of ESD protection device 100 form a plurality of diode elements 201-204. More specifically, isolated p-well/base region 113 and N+ emitter/collector region 111 form the anode and cathode regions, respectively, of diode element 201. Similarly, isolated p-well/base region 113 and N+ emitter/collector region 112 form the anode and cathode regions, respectively, of diode element 202. Moreover, isolated p-well/base region 113 and deep n-well region 120 form the anode and cathode regions, respectively, of diode element 203. Finally, p-type substrate 101 and deep n-well region 120 form the anode and cathode regions, respectively, of diode element 204. N-well region 110 introduces a resistance 205 between deep n-well region 120 and the $V_{DD}$ voltage supply terminal.

FIG. 2 also shows the connections between pads 1-2 and the associated microelectronic circuitry to be protected 222. In accordance with one embodiment, protected circuitry 222 includes RF circuitry. In a particular embodiment, protected circuitry 222 includes a passive RF circuit, such as an RFID device or a smart card.

Pads 1 and 2 are configured to receive a pair of signals that together form a single differential RF signal. As described above, this may be accomplished by coupling an antenna across pads 1 and 2, and directing an RF signal at this antenna. During normal operation of protected circuitry 222, the isolated p-well/base region 113 is floating, and is charged to a potential close to the negative peak of the received differential RF signal. Under these conditions, diodes 201 and 202 are reverse biased and conduct very little current. Any current conducted at this time consists only of diode leakage current. Diodes 201 and 202 exhibit a low parasitic capacitance, and therefore do not interfere significantly with the received RF signal. As a result, the received differential RF signal is provided to protected circuitry 222, substantially unaffected by ESD protection circuit 100.

During an ESD event, a high voltage pulse is applied to one of pads 1 or 2. In the described example, it is assumed that a high voltage pulse is applied to pad 1. However, it is understood that ESD protection circuit 100 will respond in a similar manner if a high voltage pulse is applied to pad 2. When the high voltage pulse on pad 1 exceeds the reverse breakdown voltage of diode 201, diode avalanche current begins to flow through this diode 201. This avalanche current serves as a base current to open (turn on) the associated lateral NPN bipolar transistor. Once the lateral NPN bipolar transistor opens, it conducts current between pad 1 and pad 2, thus discharging the ESD pulse. Note that diodes 203 and 204 do not perform any significant function during an ESD event. Rather, these diodes 203 and 204 function to isolate the isolated p-well 113 during normal operation and minimize losses of signal power from the lines connected to pads 1 and 2.

ESD protection circuit 100 can be formed in several manners, in accordance with various embodiments of the present invention.

As illustrated in FIG. 1, ESD protection circuit 100 can be fabricated using a conventional triple-well CMOS process. In this embodiment, the CMOS deep n-well implant is used to form deep n-well 120, and a CMOS n-well implant is used to form n-well 110. Isolated p-well/base region 113 is formed by a CMOS p-well implant. N+ emitter/collector regions 111 and 112 are formed by a CMOS N+ source/drain implant. N+ emitter/collector regions 111 and 112 are located in the same active region (i.e., p-well region 113), with separation of these regions 111 and 112 being implemented by the N+ source/drain mask.

Figure 3A:
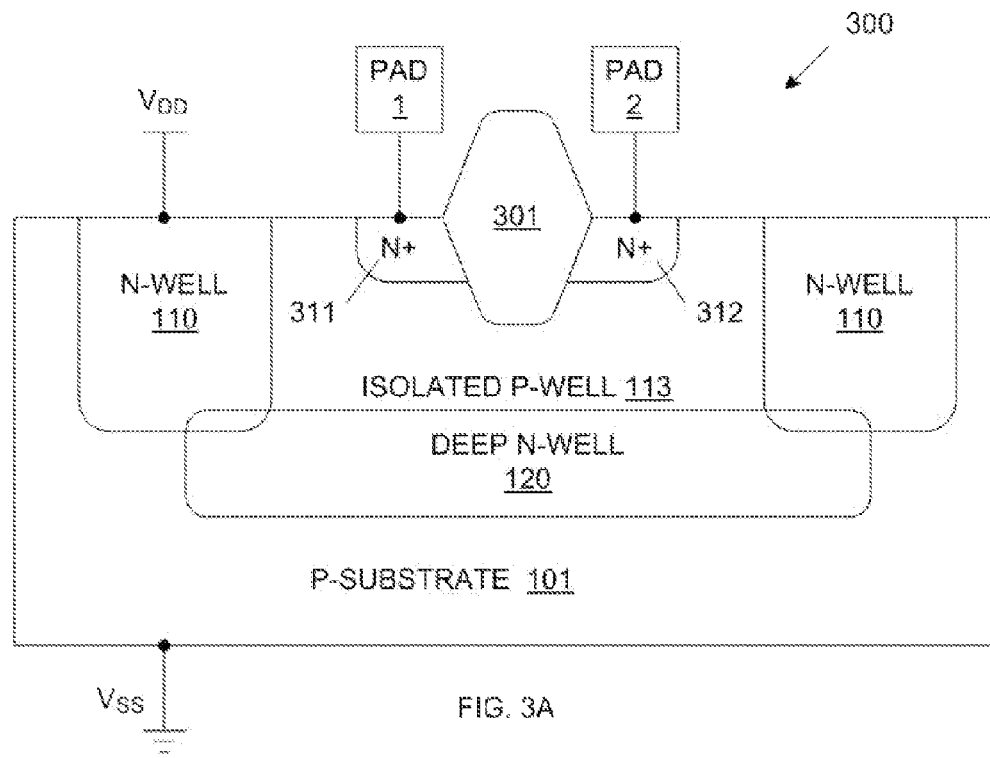
FIGS. 3A and 3B are cross-sectional views of ESD protection circuits, which are fabricated using a conventional triple-well CMOS process, in accordance with other embodiments of the present invention.

FIG. 3A is a cross-sectional view of an ESD protection circuit 300, which is fabricated using a conventional triple-well CMOS process, in accordance with another embodiment of the present invention. Because ESD protection circuit 300 is similar to ESD protection circuit 100, similar elements in FIGS. 1 and 3A are labeled with similar reference numbers. Thus, ESD protection circuit 300 includes substrate 101, n-well 110, isolated p-well/base region 113, and deep n-well 120. In addition, ESD protection circuit 300 includes N+ emitter/collector regions 311-312 and field oxide region 301, which is located between N+ emitter/collector regions 311-312. In accordance with one embodiment, field oxide region 301 is first formed by a CMOS thermal oxidation step, and N+ emitter/collector regions 311 and 312 are subsequently formed by a CMOS N+ source/drain implant. Field oxide region 301 advantageously isolates N+ emitter/collector region 311 from N+ emitter/collector region 312, thereby reducing leakage (and parasitic losses) between these regions 311-312 during normal operation. The leakage between regions 311 and 312 (FIG. 3) will be less than the leakage between regions 111 and 112 (FIG. 1). Other dielectric materials can be used in other embodiments.

Figure 3B:
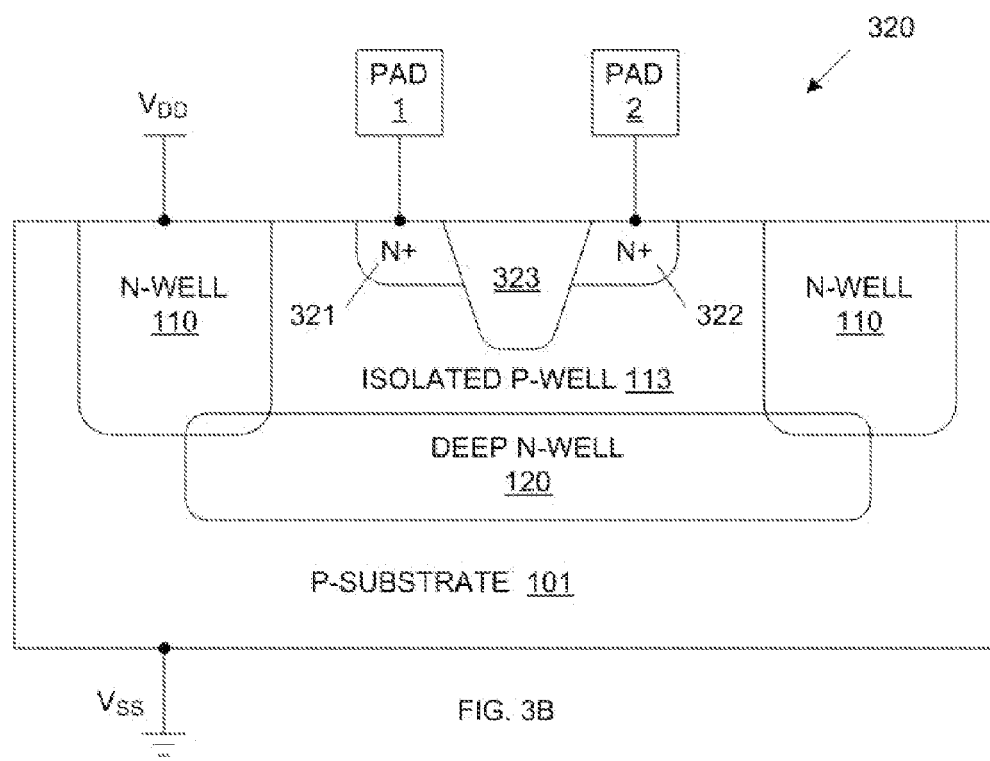

FIG. 3B is a cross sectional view of an ESD protection circuit 320, which is similar to ESD protection circuit 300. The only difference between ESD protection circuits 300 and 320 is that field oxide region 301 is replaced with a shallow trench isolation (STI) region 323. STI region 323 may provide for closer spacing of the associated N+ emitter/collector regions 321 and 322, due to the compact layout (substantially vertical sidewalls) of the STI structure. STI region 323, which is substantially coplanar with the upper surface of substrate 101, performs the same function as field oxide region 301.

Figure 4A:
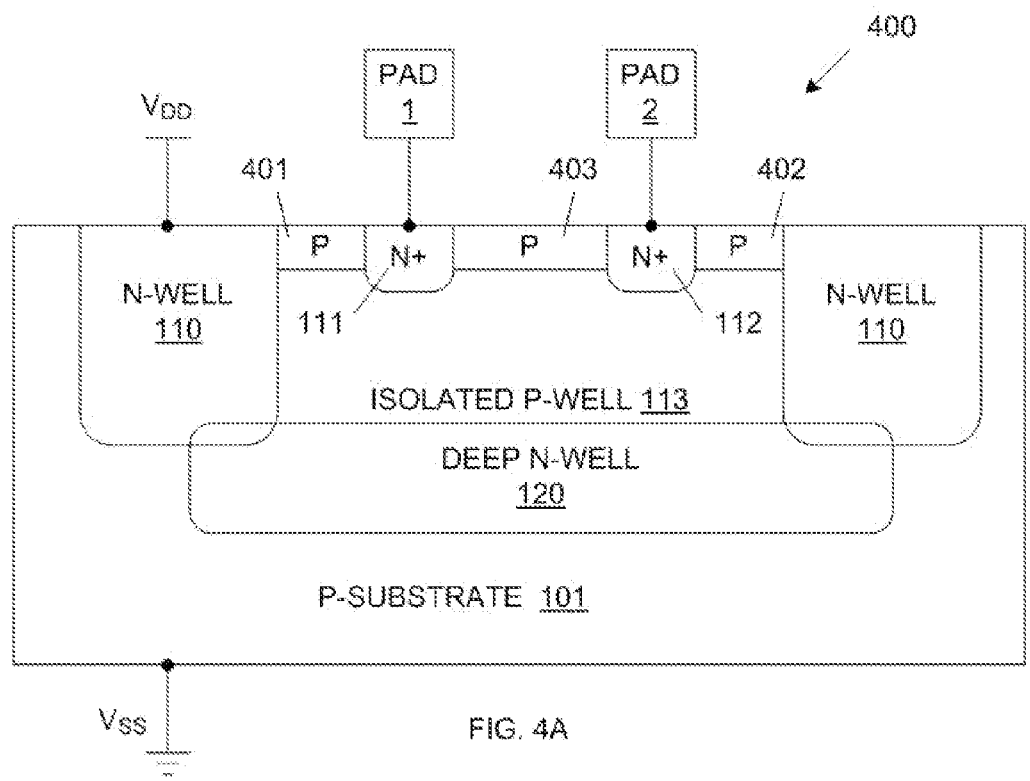
FIGS. 4A and 4B are cross-sectional views of ESD protection circuits, which represent variations of the embodiments illustrated by FIGS. 3A and 3B.
Figure 4B:
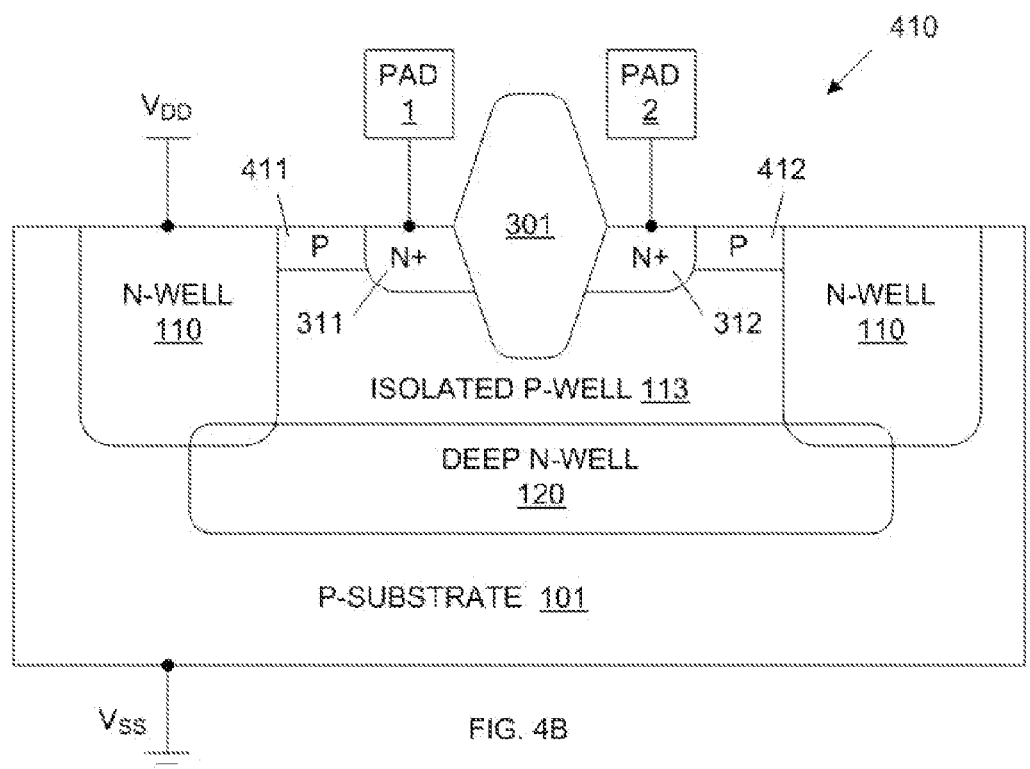

FIGS. 4A and 4B are cross-sectional views of ESD protection circuits 400 and 410, respectively, in accordance with other embodiments of the present invention. More specifically, ESD protection circuits 400 and 410 are variations of ESD protection circuits 100 (FIG. 1) and 300 (FIG. 3A), respectively. Because ESD protection circuits 400 and 410 are similar to ESD protections circuits 100 and 300, similar elements in FIGS. 1, 3A and 4A-4B are labeled with similar reference numbers.

ESD protection circuit 400 of FIG. 4A includes all of the elements of ESD protection circuit 100, plus P-type implant regions 401-403, which are formed at the upper surface of the isolated p-well/base region 113. It is understood that P− type implant regions 401-403 are connected outside the plane of FIG. 4A. In accordance with one embodiment, P− type implant regions 401-403 are formed during a CMOS P− source/drain extension implant step. Alternately, P− type implant regions 401-403 can be formed by a P− blanket implant. The dopant concentration of P− type implant regions 401-403 is selected to control the triggering voltage of the lateral NPN bipolar transistor. More specifically, the dopant concentration of P− type implant regions 401-403 is selected to control the breakdown voltage of the diode 201 formed by N+ region 111 and isolated p-well/base region 113, and the diode 202 formed by N+ emitter/collector region 112 and isolated p-well/base region 113. A higher p-type dopant concentration in regions 401-402 will decrease the voltage at which breakdown (i.e., the onset of reverse leakage current) occurs. This is an advantage if the protected circuitry is sensitive to a high voltage level, because the voltage at which the ESD device 400 turns on is lowered.

ESD protection circuit 410 of FIG. 4B includes all of the elements of ESD protection circuit 300, plus p-type implant regions 411-412, which are formed at the upper surface of the isolated p-well region 113. It is understood that P-type implant regions 411-412 may be connected outside the plane of FIG. 4B. P-type implant regions 411-412 are formed in the same manner as p-type implant regions 401-403 (FIG. 4A). Similarly, the dopant concentration of p-type implant regions 411-412 is selected to control the breakdown voltage of the diode elements formed by N+ emitter/collector regions 311-312 and isolated p-well/base region 113. In another variation, the field oxide region 301 of ESD protection circuit 410 can be replaced with STI region 310.

Figure 5:
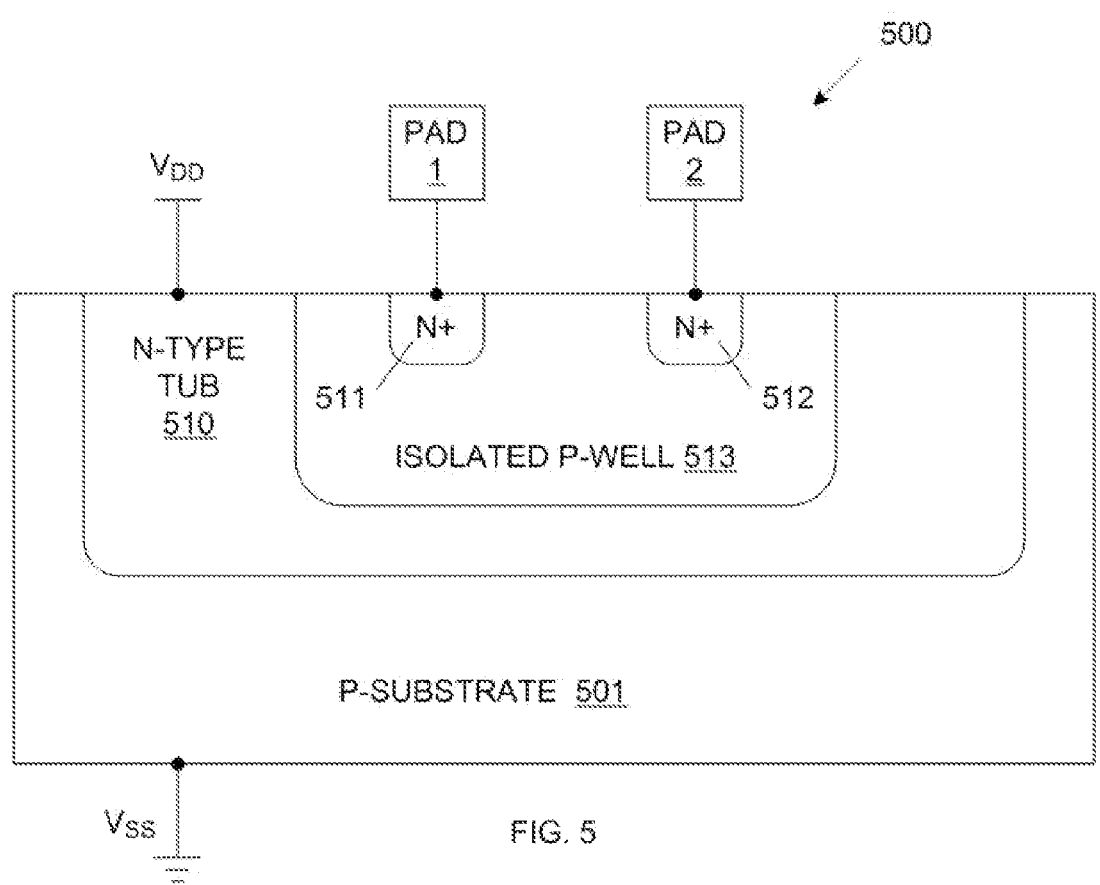
FIG. 5 is a cross-sectional view of an ESD protection circuit, which is fabricated using a standard planar CMOS process, in accordance with another embodiment of the present invention.

FIG. 5 is a cross-sectional view of ESD protection circuit 500, which is fabricated using a standard planar CMOS process, in accordance with another embodiment of the present invention. In this embodiment, an n-type tub region 510 is implanted in p-type semiconductor substrate 501, using a conventional process step. A low dose p-type implant (P− implant) is used to form isolated p-well/base region 513 inside of n-type tub region 510. N+ emitter/collector regions 511 and 512 are formed by a high dose n-type implant (N+ implant). N+ type emitter/collector regions 511 and 512 are separated by an n-type region defining mask. The masks required to form n-type tub region 510, isolated p-well region 513, and N+ emitter/collector regions 511-512 are conventional masks in a standard planar CMOS process. Thus, no additional masks (or process steps) are required to fabricate ESD protection circuit 500. ESD protection circuit 500 can be modified to include a dielectric structure (similar to field oxide layer 301 or STI region 323) between N+ emitter/collector regions 511 and 512 as described above in connection with FIGS. 3A and 3B. Similarly, ESD protection circuit 500 can be modified to include p-type implant regions at the upper surface of isolated p-well/base region 513, (similar to p-type implant regions 401-403 or 411-412) as described in connection with FIGS. 4A and 4B.

Each of the above-described ESD protection devices of the present invention is capable of receiving a differential RF signal across pads 1 and 2. It is important to note that at any given time, the RF signal applied to pad 1 may be positive or negative with respect to the RF signal applied to pad 2. The changing relative polarities of the voltages applied to pads 1 and 2 do not adversely affect the ESD protection devices of the present invention, and has no influence on losses during normal operation.

Moreover, during normal operation of the protected circuitry 222, the isolated p-well/base region 113 of the ESD protection circuit of the present invention is charged to a potential that is close to the negative peak of the RF input signal. Under these conditions, the ESD protection circuit advantageously exhibits a low parasitic capacitance and a low leakage current associated with a reverse biased diode element.

In addition, the lateral NPN transistor used to implement the ESD protection circuit of the present invention is not triggered by the rate of rise of the signals on pads 1-2, but rather, by the voltage levels of these signals. This triggering mechanism renders the ESD protection circuit suitable for protecting high frequency RF circuits.

Although the present invention has been described in connection with several embodiments, it is understood that this invention is not limited to the embodiments disclosed, but is capable of various modifications, which would be apparent to a person skilled in the art. For example, the various described n-type and p-type regions can be interchanged to provide similar results. Moreover, other fabrication options include, but are not limited to: (1) forming the P− base region 113 together with CMOS P-well regions, and forming the N+ regions 111-112 together with CMOS N+ source/drain regions; (2) forming the P− base region 113 and the N+ regions 111-112 by special ion implantation steps; and (3) using an n-type substrate and forming the P− base region 113 together with CMOS P-well regions. Thus, the invention is limited only by the following claims.

We claim:

1. An electrostatic discharge (ESD) protection circuit for preventing damage to a protected circuit configured to receive a high frequency differential signal from a first pad and a second pad, the ESD protection circuit comprising:

a first diode having a cathode coupled to the first pad;
a second diode having a cathode coupled to the second pad;
a third diode having an anode coupled to an anode of the first diode and an anode of the second diode, and a cathode coupled to a first voltage supply terminal; and
a fourth diode having a cathode coupled to the cathode of the third diode, and an anode coupled to a second voltage supply terminal.

2. The ESD protection circuit of claim 1, wherein the first voltage supply terminal is configured to receive a positive supply voltage, and the second voltage supply terminal is configured to receive a ground voltage.

3. The ESD protection circuit of claim 1, wherein the cathode of the first diode comprises a first n-type region continuous with a first surface of a semiconductor substrate, and wherein the cathode of the second diode comprises a second n-type region continuous with the first surface of the semiconductor substrate.

4. The ESD protection circuit of claim 3, wherein the anodes of the first, second and third diodes comprise a p-well region, wherein the first and second n-type regions are located within the p-well region.

5. The ESD protection circuit of claim 4, wherein the cathodes of the third and fourth diodes comprise an n-well region, wherein the p-well region is located within the n-well region.

6. The ESD protection circuit of claim 5, wherein the n-type well region comprises an n-type tub.

7. The ESD protection circuit of claim 5, wherein the n-type well region comprises an n-well region having a portion that is continuous with the first surface of the semiconductor substrate, and a deep n-well region that is located entirely below the first surface of the semiconductor substrate and has one or more portions that are continuous with the n-well region.

8. The ESD protection circuit of claim 3, further comprising a dielectric region located between the first and second n-type regions.

9. The ESD protection circuit of claim 8, wherein the dielectric region comprises a field oxide layer.

10. The ESD protection circuit of claim 8, wherein the dielectric region comprises a shallow trench isolation (STI) structure.

11. The ESD protection circuit of claim 4, further comprising one or more p-type breakdown enhancement regions continuous with the first surface of the semiconductor substrate, the p-well region, and the first and second n-type regions.

12. The ESD protection circuit of claim 1, further comprising a resistance located between the cathodes of the third and fourth diodes and the first voltage supply terminal.

13. A microelectronic device comprising:
a first pad and a second pad configured to receive a high frequency differential input signal;
a lateral bipolar transistor having an emitter connected to the first pad and a collector connected to the second pad; and
a core circuit coupled to receive the high frequency differential input signal from the first and second pads, wherein the core circuit is protected from electrostatic discharge (ESD) events by the lateral bipolar transistor.

14. The microelectronic device of claim 13, wherein the microelectronic device is a passive device.

15. The microelectronic device of claim 13, further comprising an antenna coupled to the first and second pads and configured to receive a high frequency input signal, and in response, provide the high frequency differential input signal to the first and second pads.

16. The microelectronic device of claim 15, wherein the high frequency input signal comprises a sole power source for the microelectronic device.

17. The microelectronic device of claim 13, wherein the lateral bipolar transistor comprises:
a first well region having a first conductivity type, wherein the emitter and the collector each comprise a region having a second conductivity type, opposite the first conductivity type, located in the first well region;
a second well region having the second conductivity type, wherein the first well region is located within the second well region, thereby isolating the first well region; and
a substrate region having the first conductivity type, wherein the second well region is located within the substrate region.

18. The microelectronic device of claim 17, wherein the first conductivity type is p-type and the second conductivity type is n-type.

19. The microelectronic device of claim 17, wherein the second well region is configured to receive a positive supply voltage, and the substrate region is configured to receive a ground voltage.

20. The microelectronic device of claim 17, wherein the emitter region and the collector region are continuous with a first surface of the semiconductor substrate.

21. The microelectronic device of claim 17, wherein the second well region comprises a tub region.

22. The microelectronic device of claim 17, wherein the second well region comprises:
a first region having a portion that is continuous with a first surface of the semiconductor region, and
a deep region that is located entirely below the first surface of the semiconductor substrate and has one or more portions that are continuous with the first region.

23. The microelectronic device of claim 17, wherein the lateral bipolar transistor further comprises a dielectric region located between the emitter region and the collector region.

24. The microelectronic device of claim 17, wherein the dielectric region comprises a field oxide layer.

25. The microelectronic device of claim 17, wherein the dielectric region comprises a shallow trench isolation (STI) structure.

26. The microelectronic device of claim 17, wherein the lateral bipolar transistor further comprises one or more breakdown enhancement regions of the first conductivity type that are continuous with the first well region, the emitter region and the collector region.

27. A method comprising:
applying a high frequency differential input signal to a first pad and a second pad of a microelectronic device, such that the high frequency differential input signal is provided from the first and second pads to a core circuit;
discharging current associated with an electrostatic discharge (ESD) event between the first and second pads through a lateral bipolar transistor having an emitter connected to the first pad, a collector connected to the second pad, and a floating isolated base.

28. The method of claim 27, further comprising isolating the emitter and collector of the lateral bipolar transistor with a dielectric material.

29. The method of claim 27, further comprising reducing a reverse breakdown voltage of the lateral bipolar transistor by increasing a dopant concentration in the base.

30. The method of claim 27, further comprising operating microelectronic device as a passive device.

31. The method of claim 27, further comprising coupling an antenna to the first and second pads, such that the first and second pads receive the high frequency differential input signal from the antenna.

32. The method of claim 31, further comprising powering the core circuit from the high frequency differential input signal.

* * * * *